(12) United States Patent
Welchko

(10) Patent No.: US 8,054,660 B2
(45) Date of Patent: Nov. 8, 2011

(54) INVERTER MODULE WITH THERMALLY SEPARATED SEMICONDUCTOR DEVICES

(75) Inventor: Brian A. Welchko, Torrance, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 793 days.

(21) Appl. No.: 12/123,300

(22) Filed: May 19, 2008

(65) Prior Publication Data

US 2009/0285004 A1    Nov. 19, 2009

(51) Int. Cl.
    *H02M 7/537* (2006.01)
(52) U.S. Cl. ...................................... 363/131
(58) Field of Classification Search .......... 363/131, 363/144, 145, 147; 307/10.6; 318/140, 158
See application file for complete search history.

(56) References Cited

U.S. PATENT DOCUMENTS

| | | | |
|---|---|---|---|
| 6,977,475 B2 * | 12/2005 | Kuribayashi et al. | 318/140 |
| 7,356,441 B2 * | 4/2008 | Kerkman et al. | 702/182 |

* cited by examiner

*Primary Examiner* — Adolf Berhane
(74) *Attorney, Agent, or Firm* — Ingrassia Fisher & Lorenz P.C.

(57) ABSTRACT

Systems and apparatus are provided for an inverter module for use in a vehicle. The inverter module comprises a first electrical base and a second electrical base each having an electrically conductive mounting surface, wherein the electrical bases are physically distinct and electrically coupled. A first semiconductor switch has a surface terminal that is coupled to the electrically conductive mounting surface of the first electrical base. A second semiconductor switch has a surface terminal that is coupled to the electrically conductive mounting surface of the first electrical base. A first semiconductor diode and a second semiconductor diode each have a surface terminal, the surface terminals are coupled to the electrically conductive mounting surface of the second electrical base. The first semiconductor switch and first semiconductor diode are antiparallel, and the second semiconductor switch and second semiconductor diode are antiparallel.

20 Claims, 5 Drawing Sheets

INVERTER MODULE WITH THERMALLY SEPARATED SEMICONDUCTOR DEVICES

TECHNICAL FIELD

Embodiments of the subject matter described herein relate generally to electric circuits and modules, and more particularly, embodiments of the subject matter relate to device layouts for power inverter modules that drive electric motors.

BACKGROUND

In recent years, advances in technology, as well as ever evolving tastes in style, have led to substantial changes in the design of automobiles. One of the changes involves the power usage and complexity of the various electrical systems within automobiles, particularly alternative fuel vehicles, such as hybrid, electric, and fuel cell vehicles.

Many of the electrical components, including the electric motors used in such vehicles, receive electrical power from alternating current (AC) power supplies. However, the power sources (e.g., batteries) used in such applications provide only direct current (DC) power. Thus, devices known as "power inverters" are used to convert the DC power to AC power, which often utilize several of switches, or transistors, operated at various intervals to convert the DC power to AC power.

In many inverters, the switches have antiparallel diodes connected across each switch to provide a path for the load current (i.e., the motor current) when the switch is off. The transistors and diodes are often implemented using semiconductor devices placed on the same electrical substrate to create an inverter module. The substrate is often made of copper or another conductive material, which also generally has a high thermal conductivity, thereby causing the transistors and diodes packaged together to operate at the same temperature.

Commercially available silicon-carbide diodes are capable of operating efficiently at higher operating temperatures than silicon counterparts. However, most semiconductor transistors or switches are formed from silicon. Because the diodes and transistors are thermally coupled by virtue of their physical proximity and placement on the same electrical substrate, the silicon devices determine the maximum operating temperature for the inverter module and limit the operating temperature of silicon-carbide diodes. Furthermore, the silicon devices require higher surface area electrical substrates in order to avoid exceeding the maximum operating temperature, and also affect the placement of the electrical substrate within the inverter module. Thus, current inverter layouts deprive vehicle power systems of the advantages afforded by silicon-carbide devices.

BRIEF SUMMARY

An apparatus is provided for an inverter module for use in a vehicle. The inverter module comprises a first electrical base having an electrically conductive mounting surface. A first semiconductor switch has a surface terminal, wherein the first semiconductor switch is affixed to the first electrical base such that the surface terminal of the first semiconductor switch is coupled to the electrically conductive mounting surface of the first electrical base. A second semiconductor switch has a surface terminal, wherein the second semiconductor switch is affixed to the first electrical base such that the surface terminal of the second semiconductor switch is coupled to the electrically conductive mounting surface of the first electrical base. The inverter module further comprises a second electrical base having an electrically conductive mounting surface, wherein the second electrical base is electrically coupled to the first electrical base and is physically distinct from the first electrical base. A first semiconductor diode has a surface terminal, wherein the first semiconductor diode is affixed to the second electrical base such that the surface terminal of the first semiconductor diode is coupled to the electrically conductive mounting surface of the second electrical base. A second semiconductor diode has a surface terminal, wherein the second semiconductor diode is affixed to the second electrical base such that the surface terminal of the second semiconductor diode is coupled to the electrically conductive mounting surface of the second electrical base.

An apparatus is provided for an inverter phase leg module. The inverter phase leg module comprises a positive bus bar configured to establish a positive voltage potential for the inverter phase leg module. A negative bus bar is configured to establish a negative voltage potential for the inverter phase leg module. The inverter phase leg module further comprises an output node and a first electrically conductive base coupled to the output node. A first switch package has a first surface terminal coupled to the first electrically conductive base and a second surface terminal coupled to the positive bus bar. A second switch package has a first surface terminal coupled to the first electrically conductive base and a second surface terminal coupled to the negative bus bar. The inverter phase leg module further comprises a second electrically conductive base coupled to the output node, wherein the second electrically conductive base and the first electrically conductive base are physically distinct. A first diode package has a first surface terminal coupled to the second electrically conductive base and a second surface terminal coupled to the positive bus bar. A second diode package has a first surface terminal coupled to the second electrically conductive base and a second surface terminal coupled to the negative bus bar.

An apparatus is provided for a power inverter module. The power inverter module comprises a first electrical base, wherein the first electrical base is electrically conductive. A first transistor switch device has a surface terminal, wherein the surface terminal of the first transistor switch device is coupled to the first electrical base. A second transistor switch device has a surface terminal, wherein the surface terminal of the second transistor switch device is coupled to the first electrical base. The power inverter module further comprises a second electrical base electrically coupled to, and thermally decoupled from, the first electrical base, wherein the second electrical base is electrically conductive. A first diode device has a surface terminal, wherein the surface terminal of the first diode device is coupled to the second electrical base. A second diode device has a surface terminal, wherein the surface terminal of the second diode device is coupled to the second electrical base.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
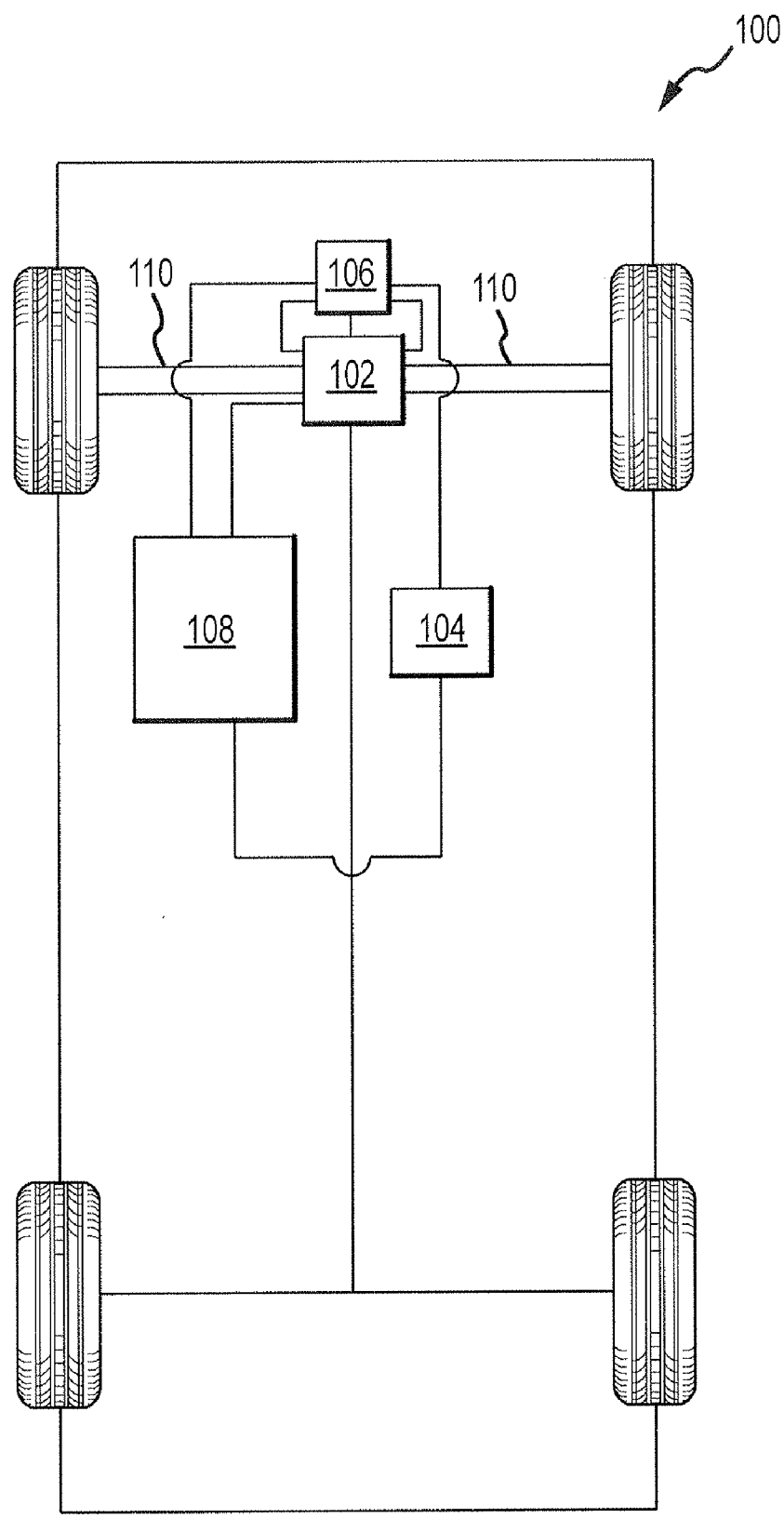
FIG. 1 is a block diagram of an exemplary automobile in accordance with one embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter. In addition, certain terminology may also be used in the following description for the purpose of reference only, and thus is not intended to be limiting. The terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

For the sake of brevity, conventional techniques related to analog circuit design, signaling, switch control, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Technologies and concepts discussed herein relate generally to the layout of devices and/or components in a power inverter module. The subject matter discussed herein may be utilized to reduce the surface area and/or volume of an inverter module and operate the devices and/or components at different temperatures to improve efficiency.

FIG. 1 illustrates a vehicle, or automobile 100, in accordance with one embodiment. In an exemplary embodiment, the automobile 100 includes a motor 102, an energy source 104, a power inverter assembly 106, an electronic control system 108, and a drive shaft 110. In an exemplary embodiment, the energy source 104 is in operable communication and/or electrically coupled to the electronic control system 108 and the power inverter assembly 106. The power inverter assembly 106 is coupled to the motor 102, which in turn is coupled to the drive shaft 110. The power inverter assembly 106 is in operable communication and/or electrically coupled to the electronic control system 108 and is configured to provide electrical energy and/or power from the energy source 104 to the motor 102 as discussed in greater detail below.

Depending on the embodiment, the automobile 100 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The automobile 100 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and natural gas) fueled engine, a combustion/electric motor hybrid engine, and an electric motor.

In the exemplary embodiment illustrated in FIG. 1, the motor 102 may comprise an electric motor, a generator, a traction motor, or another suitable motor known in the art. The motor 102 may be an induction motor, a permanent magnet motor, or any type suitable for the desired application. The motor 102 may also include a transmission integrated therein such that the motor 102 and the transmission are mechanically coupled to the drive shaft 110.

Depending on the embodiment, the energy source 104 may comprise a battery, a fuel cell, an ultracapacitor, or another suitable voltage source. It should be understood that although FIG. 1 depicts an automobile 100 having one energy source 104, the principles and subject matter discussed herein are independent of the number or type of energy source, and apply to vehicles having any number of energy sources. Although not shown in detail, the electronic control system 108 includes various sensors and automotive control modules, or electronic control units (ECUs), such as an inverter control module for controlling the power inverter assembly 106 as described below.

Figure 2:
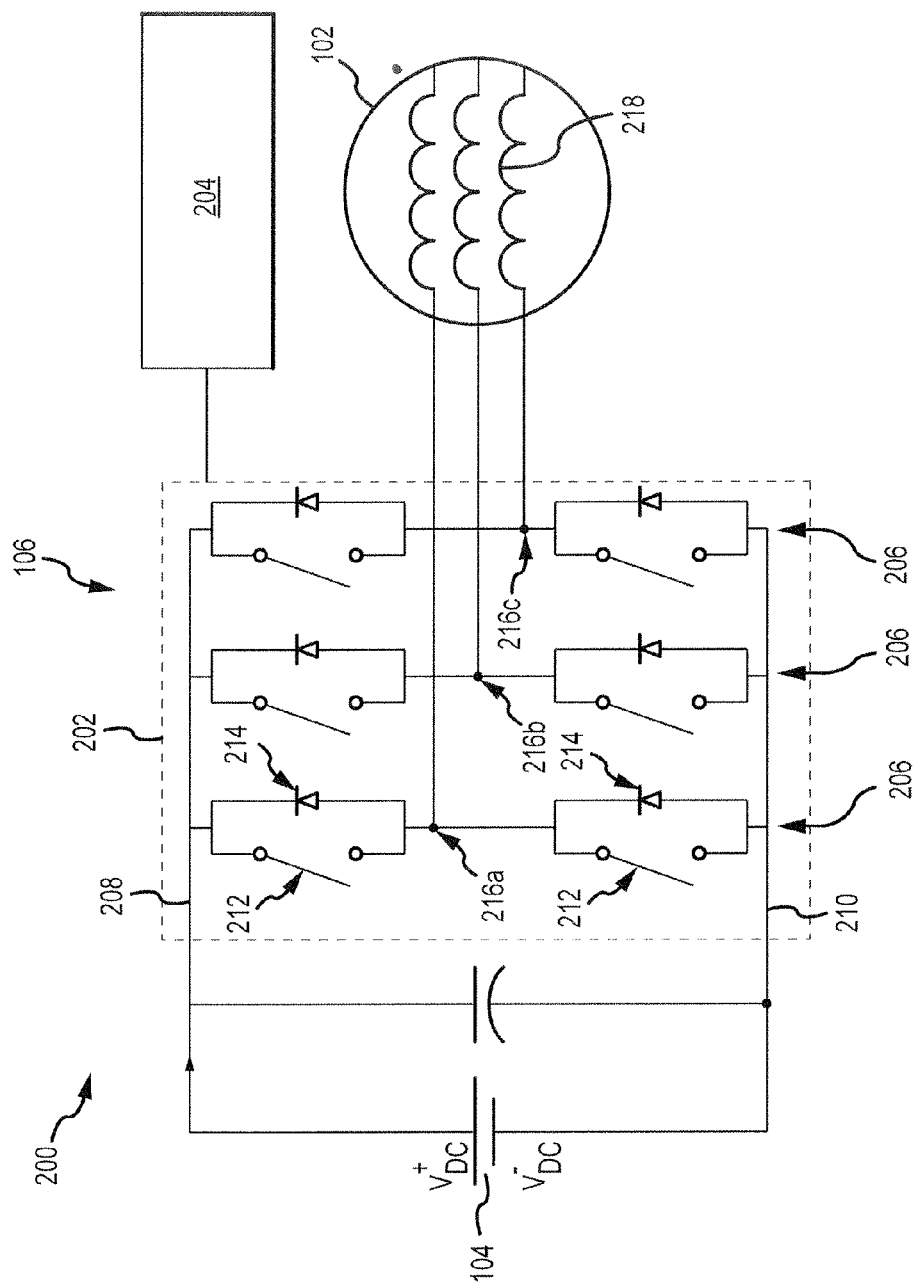
FIG. 2 is a schematic diagram of an inverter system in accordance with one embodiment suitable for use in the automobile of FIG. 1.

Referring now to FIG. 2, in an exemplary embodiment, an inverter system 200 for use in the automobile 100 of FIG. 1 includes the motor 102, the energy source 104, the power inverter assembly 106, and a controller 204. In an exemplary embodiment, the motor 102 is a multi-phase alternating current (AC) motor and includes a set of windings 218 (or coils), wherein each winding corresponds to one phase of the motor 102. The power inverter assembly 106 includes an inverter 202 having one or more phase legs 206, a positive bus 208, and a negative bus 210. Each phase leg 206 includes switches 212, diodes 214, and a respective output node 216a-c between sets of switches 212 and diodes 214 as shown and discussed in greater detail below. In an exemplary embodiment, the inverter system 200 is configured to convert DC voltage from the energy source 104 into AC voltage across the windings 218 in order to power the motor 102, as is commonly understood in the art.

As shown for an exemplary embodiment, the motor 102 and inverter system 200 have three phases. However, the principles and subject matter discussed herein apply to a system with any number of phases, and may be modified accordingly as will be appreciated in the art. Furthermore, the power inverter assembly 106 may include additional inverters, and additional energy sources may be used.

Referring again to FIG. 2, in an exemplary embodiment, each phase leg 206 is coupled between the positive bus 208 and the negative bus 210. Each phase leg 206 includes switches 212 (e.g., semiconductor devices, such as transistors) with a diode 214 coupled antiparallel to each switch 212. The switches 212 and diodes 214 are antiparallel, meaning they are electrically in parallel with reversed or inverse polarity. The antiparallel configuration allows for bidirectional current flow while blocking voltage unidirectionally, as will be appreciated in the art. In this configuration, the direction of current through the switches 212 is opposite to the direction of allowable current through the respective diodes 214. Each phase leg 206 further includes an output node 216a-c between sets of switch and diode pairs as shown and discussed in greater detail below.

In an exemplary embodiment, the positive bus 208 is configured to receive a positive voltage potential, and may be coupled to a positive terminal of the energy source 104. The negative bus 210 is configured to receive a negative voltage potential, and may be coupled to a negative terminal of the energy source 104. The windings 218 (or phases) of the motor 102 are electrically coupled to output nodes 216a-c of corresponding phase legs 206.

In an exemplary embodiment, the controller 204 is in operable communication and/or electrically coupled to the inverter 202. The controller 204 is responsive to commands received from the driver of the automobile 100 (i.e. via an accelerator pedal) or alternatively, commands may be received from the electronic control system 108. The controller 204 provides commands to the inverter 202 to control the output at the output nodes 216a-c by employing high frequency pulse width modulation (PWM) of the switches 212, as is understood in the art.

In practice, elements of the inverter system 200 such as the inverter 202 can be packaged and/or implemented using a circuit module having characteristics that support the intended application, e.g., switching circuits with bidirectional current flow and high power capacity. The module may be coupled to other system components (such as the energy source 104 and/or the motor 102) and located within a vehicle drivetrain according to various space and form factor requirements. In this regard, FIG. 3 is a top view of an embodiment of an inverter phase leg module 300 suitable for use with inverter system 200, and FIG. 4 is a cross sectional view of the inverter phase leg module 300, as viewed along line 4-4 in FIG. 3.

Figure 3:
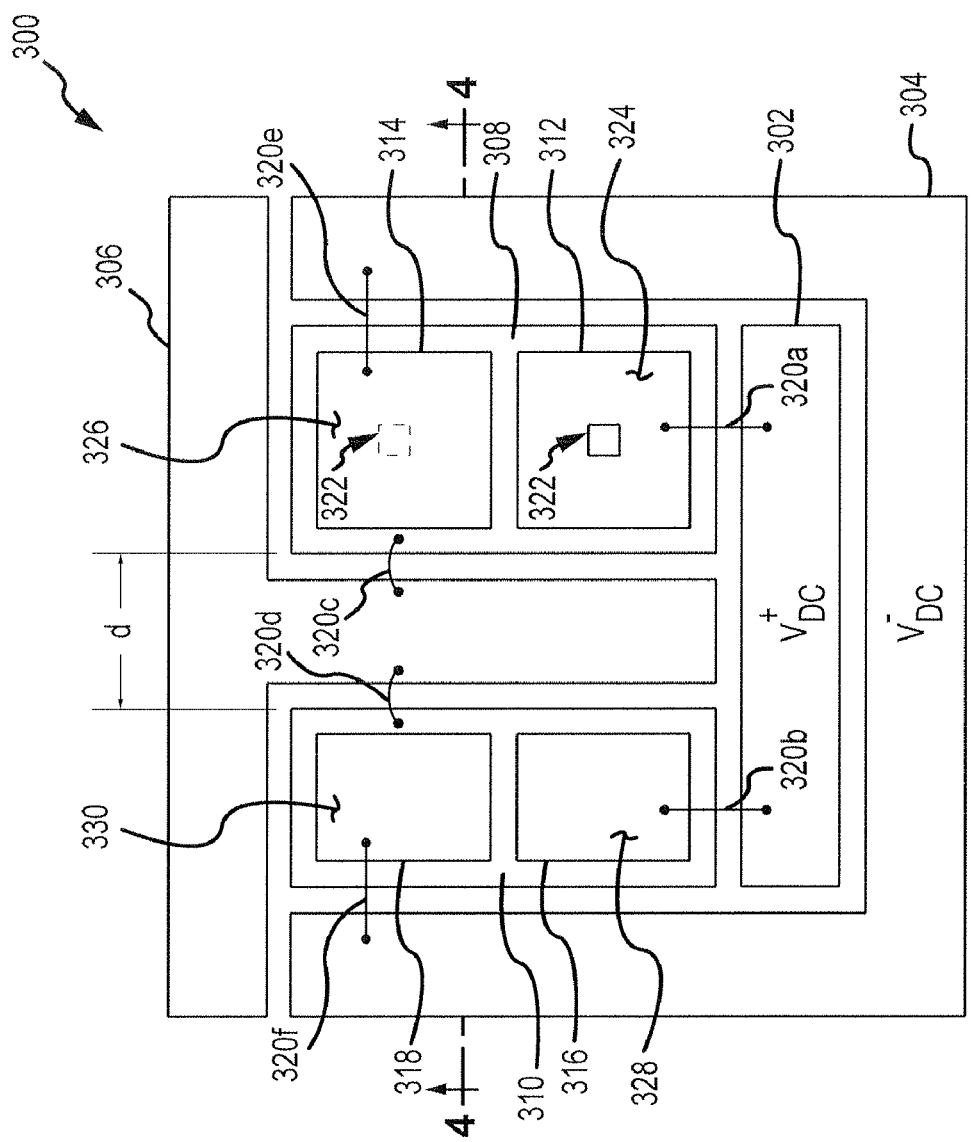
FIG. 3 is a diagram illustrating a top view of an embodiment of an inverter phase leg module suitable for use in the inverter system of FIG. 2.
Figure 4:
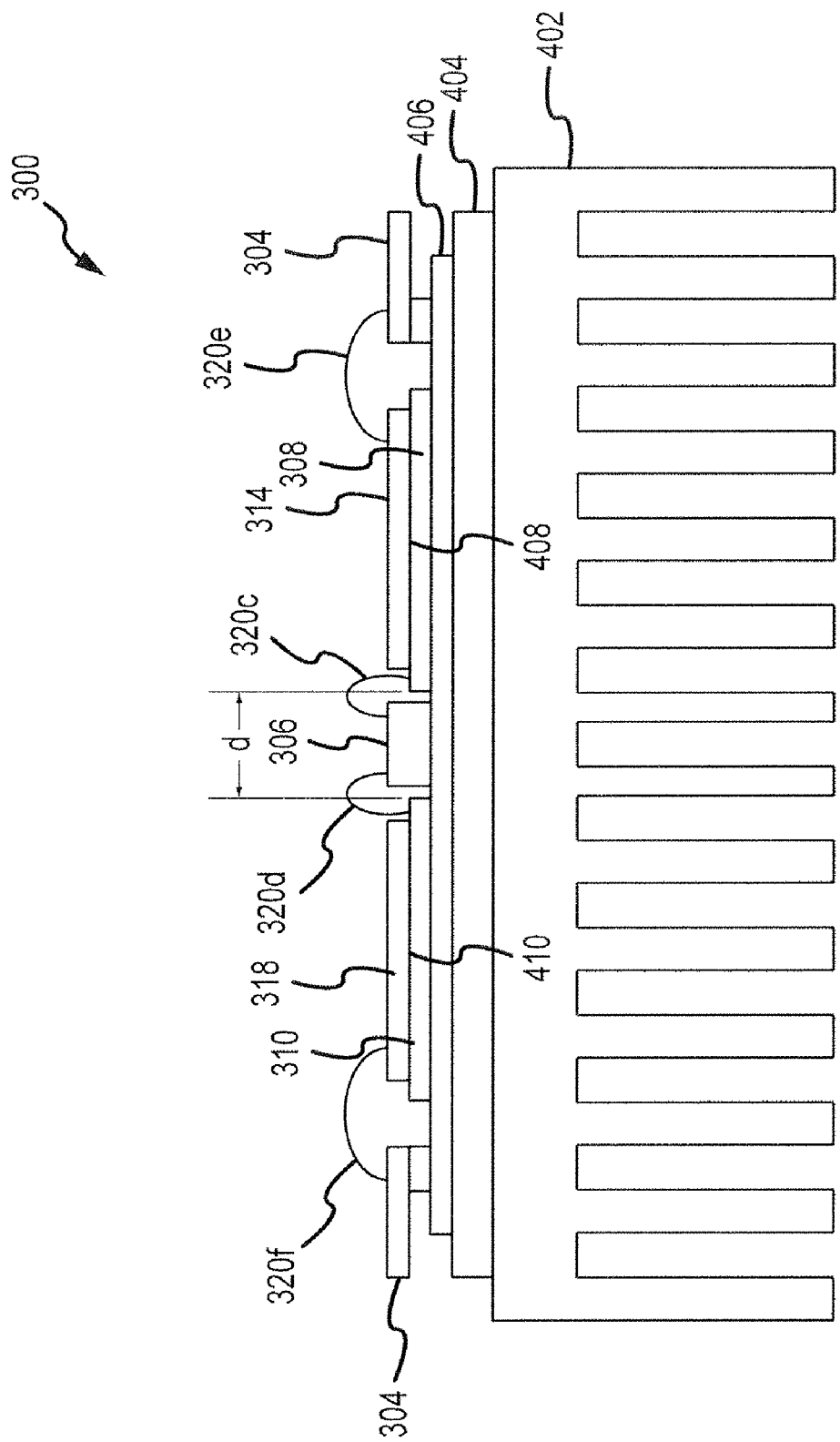
FIG. 4 is a cross-sectional view of the inverter phase leg module of FIG. 3 as viewed from line 4-4.

Referring now to FIGS. 3 and 4, this particular embodiment of inverter phase leg module 300 includes a positive bus bar 302, a negative bus bar 304, and an output node 306. The inverter phase leg module 300 further includes a first electrical base 308, a second electrical base 310, a first switch 312, a second switch 314, a first diode 316, and a second diode 318. In an exemplary embodiment, the switches 312, 314 and diodes 316, 318 are realized as semiconductor devices or packages having conductive electrical terminals on planar surfaces (i.e., the top surface and the bottom surface) of the device or package as discussed in greater detail below. It should be understood that FIG. 3 depicts merely one of many possible layouts or topologies in accordance with the subject matter described herein.

Referring now to FIG. 4, in an exemplary embodiment, the inverter phase leg module 300 may further include a heat sink 402, a baseplate 404, and an electrical insulator 406. In an exemplary embodiment, the heat sink 402 provides physical support for the inverter phase leg module 300 and dissipates heat and/or thermal energy as is known in the art. The baseplate 404 provides additional physical support and may be formed from copper or another suitable material. The insulator 406 provides electrical isolation between layers and may be formed of alumina, aluminum nitride material or another comparable material. The remaining elements of the inverter phase leg module 300 may be mounted on the insulator 406, as described in greater detail below. It should be understood that the inverter phase leg module 300 shown is an exemplary embodiment, and that in other embodiments, the inverter phase leg module 300 may be further modified to include additional layers (i.e., additional insulators and electrical bases), additional components, and that the various layers may be interconnected, as will be appreciated in the art.

Referring again to FIGS. 3-4, in an exemplary embodiment, the positive bus bar 302 may be mounted on the insulator 406. The positive bus bar 302 may be coupled to the top surface terminal 324 of the first switch 312 using a suitable electrical interconnect 320a, and to the top surface terminal 328 of the first diode 316 using a suitable electrical interconnect 320b (these electrical interconnects may be realized using wire bonds). In an exemplary embodiment, the electrical interconnects 320a-f provide good electrical conductivity but have relatively low thermal conductivity and/or heat transfer properties. Although not shown, the positive bus bar 302 may be further coupled to positive voltage potential ($V_{DC}^+$), which may supplied, for example, by the energy source 104 or the positive bus 208 described above in reference to FIGS. 1 and 2. The bottom surface terminal of the first switch 312 is further coupled to the first electrical base 308. The bottom surface terminal of the first switch 312 is affixed or mounted on the first electrical base 308 to establish an electrical connection, for example, by soldering or direct physical contact. The first electrical base 308 is in turn coupled to the output node 306 using a suitable electrical interconnect 320c. The bottom surface terminal of the first diode 316 is coupled to the second electrical base 310. Similarly, the bottom surface terminal of the first diode 316 is affixed or mounted on the second electrical base to establish an electrical connection. The second electrical base 310 is in turn coupled to the output node 306 using an electrical interconnect 320d. In an exemplary embodiment, the first switch 312 and the first diode 316 are coupled antiparallel to each other, as discussed in greater detail below.

Still referring to FIGS. 3-4, in an exemplary embodiment, the negative bus bar 304 may be mounted on the insulator 406 and is coupled to the top surface terminal 326 of the second switch 314 and the top surface terminal 330 of the second diode 318 using respective electrical interconnects 320e and 320f. Although not shown, the negative bus bar 304 may be further coupled to a negative voltage potential ($V_{DC}^-$), which may be supplied, for example, by the energy source 104 or the negative bus 210 described above in reference to FIGS. 1 and 2. The bottom surface terminal 408 of the second switch 314 is coupled to the first electrical base 308 and the bottom surface terminal 410 of the second diode 318 is coupled to the second electrical base 310, in a similar manner as described above in regards to the first switch 312 and the first diode 316. In an exemplary embodiment, the second switch 314 and the second diode 318 are coupled antiparallel to each other, as discussed in greater detail below.

In an exemplary embodiment, the first electrical base 308 and the second electrical base 310 are both formed from a conductive material and have an electrically conductive planar surface for mounting semiconductor devices or packages. In an exemplary embodiment, the electrical bases 308, 310 include or are formed from a copper material or another electrically conductive alloy, material, or substrate. The electrical bases 308, 310 may be mounted on the insulator 406 as will be appreciated in the art.

It should be understood that the first electrical base 308 and the second electrical base 310 are physically distinct, and may be separated by a distance d. The physical separation also creates thermal separation and allows the first electrical base 308 and the second electrical base 310 to be effectively decoupled thermally. In turn, this thermal decoupling allows the switches 312, 314 and diodes 316, 318 to operate at different temperatures. The electrical bases 308, 310 can be sized according to the operating temperature limits of the semiconductor devices mounted thereon. Accordingly, the inverter phase leg module 300 can be fabricated using less surface area and/or volume of material. It should be noted that many different arrangements of the electrical bases 308, 310 are possible, and the distance d may be increased or influenced by various factors, such as the desired form factor of the inverter phase leg module 300.

The first electrical base 308 and the second electrical base 310 may be independently sized for different operating temperatures, and may be formed of the same or different conductive material. In an exemplary embodiment, the electrical bases 308, 310 are coupled to the output node 306 using electrical interconnects 320c and 320d. Depending on the embodiment, the output node 306 may be coupled to the stator windings of an electric motor or another module or load.

As mentioned previously, in an exemplary embodiment, the first switch 312 and the second switch 314 are semiconductor devices or packages having two planar surfaces, each surface having at least one distinct terminal thereon. The switches 312, 314 may further include a third terminal 322 or pad on one surface which is electrically isolated and distinct from the other surface terminals, as is known in the art. The third terminal 322 can be used to receive a switching control signal or voltage, and may be coupled to a control circuit (such as the controller 204 of FIG. 2) to provide switching functionality, as will be understood.

In an exemplary embodiment, the switches 312, 314 are transistors, and may be any suitable semiconductor transistor switch, such as a bipolar junction transistor (i.e., an IGBT), a field-effect transistor (i.e., a MOSFET), or any other comparable device known in the art. The top surface terminal 324 of the first switch 312 may be coupled to the positive bus bar 302 using the electrical interconnect 320a as shown. The bottom surface terminal of the first switch 312 may be coupled to the electrically conductive surface of the first electrical base 308 by soldering or a direct physical connection, such that the first switch 312 may be mounted or affixed to the first electrical base 308. Similarly, the top surface terminal 326 of the second switch 314 may be coupled to the negative bus bar 304, and its bottom surface terminal 408 may be coupled to the first electrical base 308, such that the second switch 314 may be mounted or affixed to the first electrical base 308. Depending on the embodiment, if the first switch 312 and the second switch 314 are identical or have the same physical construction, then one of the switch devices may be flipped in order to achieve proper polarity and coupling to the first electrical base 308, as described in greater detail below. In the case where one switch is flipped over, a cutout or via may need to be made in the first electrical base 308 to provide access to and/or isolation for the third terminal 322, as will be appreciated in the art.

As mentioned above, in an exemplary embodiment, the first diode 316 and the second diode 318 are semiconductor devices or packages having two planar surfaces, each surface having a distinct terminal thereon corresponding to either an anode terminal or a cathode terminal, as is known in the art. Depending on the embodiment, the diodes 316, 318 may be Schottky diodes, PiN diodes, or any other suitable diode type known in the art. The top surface terminal 328 of the first diode 316 may be coupled to the positive bus bar 302 using the electrical interconnect 320b as shown. The bottom surface terminal of the first diode 316 may be coupled to the electrically conductive surface of the second electrical base 310 by soldering or a direct physical connection, such that the first diode 316 may be mounted or affixed to the second electrical base 310. Similarly, the top surface terminal 330 of the second diode 318 may be coupled to the negative bus bar 304, and the bottom surface terminal 410 of the second diode 318 may be coupled to the second electrical base 310, such that the second diode 318 may be mounted or affixed to the second electrical base 310. In an exemplary embodiment, the cathode surface terminal of the first diode 316 is coupled to the positive bus bar 302 and the anode surface terminal is coupled to the second electrical base 310. If the first diode 316 and the second diode 318 are identical or have the same physical construction, then the second diode 318 device may be flipped over relative to the first diode 316 to couple the anode surface terminal to the negative bus bar 304 and the cathode surface terminal to the second electrical base 310, in order to achieve the proper polarity as discussed in greater detail below.

In certain embodiments, the diodes 316, 318 are semiconductor devices or packages formed from silicon-carbide material. Silicon-carbide diodes are chosen because they are capable of operating at higher temperatures than silicon counterparts. For example, silicon semiconductor devices generally have operating temperature limits between 150° C. to 175° C., while silicon-carbide semiconductor devices can operate at temperatures in excess of 250° C. This allows silicon-carbide components to be designed for smaller surface area and/or volume. For example, an electrical base having silicon-carbide diodes mounted thereon may be smaller than an electrical base having silicon transistors mounted thereon because silicon-carbide devices may operate at higher temperatures. This also allows the silicon-carbide diodes 316, 318 to operate closer to their temperature limits and thus perform more efficiently.

Referring to FIG. 2 and FIG. 3, the inverter phase leg module 300 may be suitable for use as in phase leg 206 of the inverter system 200 described above. In accordance with one embodiment, the output node 306 may be coupled to a winding 218 of the motor 102. It should be understood that to accommodate additional phase legs 206, the inverter phase leg module 300 would require distinct and additional combinations of electrical bases, switches, diodes, and respective output nodes configured as described above in reference to FIG. 3 for each additional phase motor phase.

Figure 5:
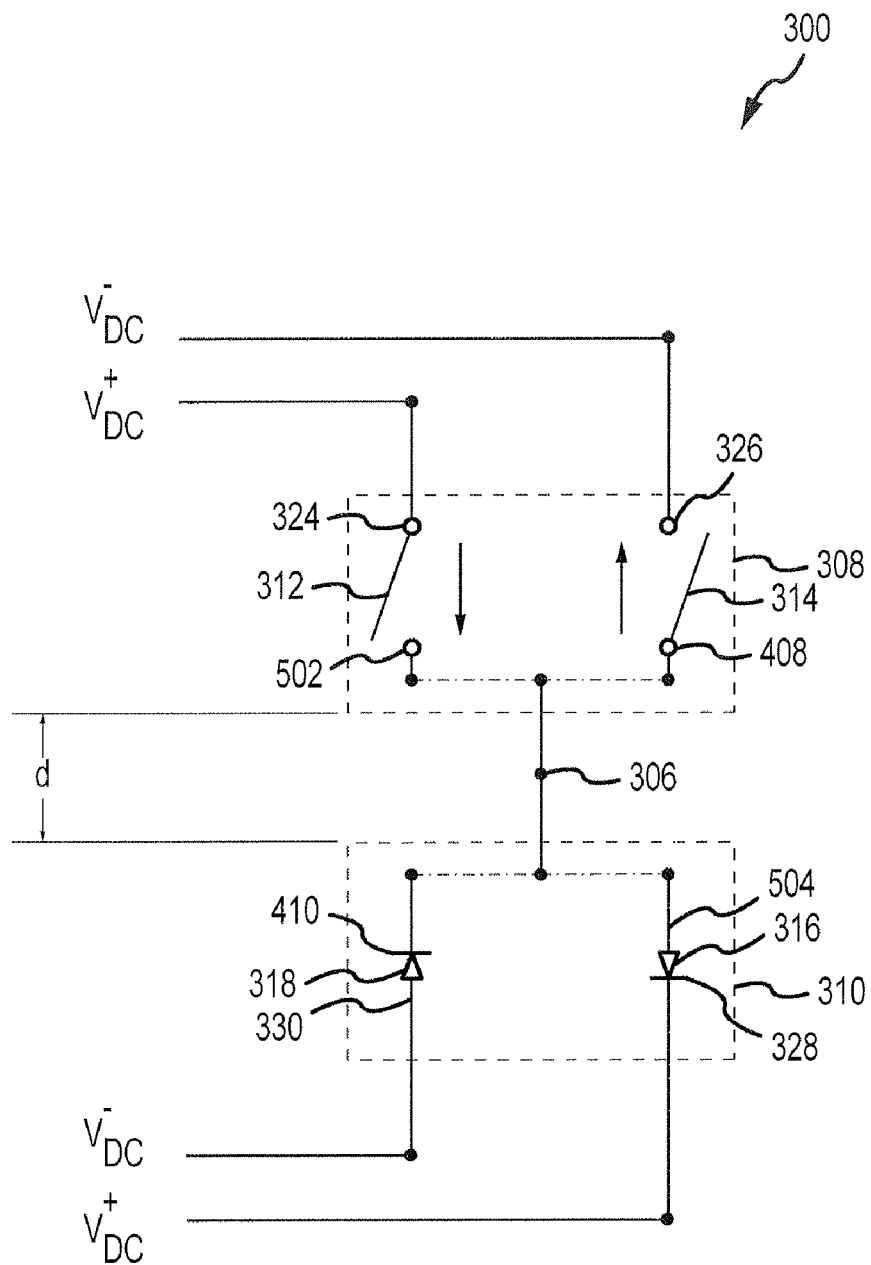
FIG. 5 is a schematic diagram of an embodiment of the inverter phase leg module of FIG. 3.

Referring now to FIG. 5, a schematic view of the inverter phase leg module 300 illustrates the configuration of the switches 312, 314 and the diodes 316, 318 for implementing the antiparallel configuration in accordance with one embodiment. Elements of the inverter phase leg module 300 are similar to their counterpart elements described above with reference to FIGS. 3-4 and will not be redundantly described in detail in the context of FIG. 5.

Referring again to FIGS. 3-5, in an exemplary embodiment, the first switch 312 includes a surface terminal 324 that is coupled to a positive voltage potential ($V_{DC}^+$) and corresponds to the collector (in the case of an bipolar junction transistor such as an IGBT), the drain (in the case of a field-effect transistor such as a MOSFET), or another comparable transistor terminal known in the art. The other (i.e., bottom) surface terminal 502 is coupled to the first electrical base 308 and corresponds to the emitter (for bipolar junction transistors), the source (for field-effect transistors), or another comparable transistor terminal known in the art. In an exemplary embodiment, the second switch 314 is of the same type and construction as the first switch 312 and has analogous surface terminals 408, 326 (i.e., a collector and an emitter), wherein second switch 314 is coupled between a negative voltage potential ($V_{DC}^-$) and the first electrical base 308.

The diodes 316, 318 each include an anode surface terminal 504, 330 and a cathode surface terminal 328, 410. In an exemplary embodiment, the cathode surface terminal 328 of the first diode 316 is coupled to the positive voltage potential ($V_{DC}^+$) and the anode surface terminal 504 of the first diode 316 is coupled to the second electrical base 310. The cathode surface terminal 410 of the second diode 318 is coupled to the second electrical base 310 and the anode surface terminal 330 is coupled to the negative voltage potential ($V_{DC}^-$). The first electrical base 308 and the second electrical base 310 are each coupled to the output node 306. It should be noted that in this configuration, the first switch 312 and the first diode 316 are antiparallel, meaning they are electrically in parallel with reversed or inverse polarity. Similarly, the second switch 314 and the second diode 318 are also antiparallel to each other.

In alternative embodiments, the switches 312, 314 and diodes 316, 318 may be duplicated on the electrical bases 308, 310 to achieve higher current or voltage ratings (i.e., increased power capacity) for the inverter phase leg module 300. For example, to achieve a higher current rating, additional switches can be added to the first electrical base 308 in parallel with the first switch 312 and the second switch 314 with the same configuration described above in reference to FIG. 5. Similarly, additional diodes can be included on the second electrical base 310 in parallel with the first diode 316 and the second diode 318. To increase the voltage rating, the additional devices would have to be coupled electrically in series (i.e., between the first switch 312 and the positive voltage potential) with the same polarity, as will be understood.

One advantage of the system and/or method described above is the vehicle inverter assembly can be designed to advantageously utilize silicon-carbide diodes to improve electrical efficiency and reduce surface area and/or volume requirements for the inverter assembly. By weakening the thermal bond between the switches and the diodes, the system can be designed for the maximum operating temperatures of the switches and the diodes independently of one another. In addition, the silicon-carbide devices are not limited in operating temperature by the silicon devices, allowing them to operate at full capacity and closer to their temperature limit. Other embodiments may utilize the systems and methods described above in different types of automobiles, different vehicles (e.g., watercraft and aircraft), or in different electrical systems altogether, such as the phase legs used in boost, buck, or buck/boost dc/dc converters.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An inverter module for use in a vehicle, the inverter module comprising:
    a first electrical base having an electrically conductive mounting surface;
    a first semiconductor switch having a surface terminal, wherein the first semiconductor switch is affixed to the first electrical base such that the surface terminal of the first semiconductor switch is coupled to the electrically conductive mounting surface of the first electrical base; and
    a second semiconductor switch having a surface terminal, wherein the second semiconductor switch is affixed to the first electrical base such that the surface terminal of the second semiconductor switch is coupled to the electrically conductive mounting surface of the first electrical base;
    a second electrical base having an electrically conductive mounting surface, the second electrical base being electrically coupled to the first electrical base, wherein the second electrical base and the first electrical base are physically distinct;
    a first semiconductor diode having a surface terminal, wherein the first semiconductor diode is affixed to the second electrical base such that the surface terminal of the first semiconductor diode is coupled to the electrically conductive mounting surface of the second electrical base; and
    a second semiconductor diode having a surface terminal, wherein the second semiconductor diode is affixed to the second electrical base such that the surface terminal of the second semiconductor diode is coupled to the electrically conductive mounting surface of the second electrical base.

2. The inverter module of claim 1, wherein the first electrical base and the second electrical base are formed from a copper material.

3. The inverter module of claim 1, wherein the first semiconductor diode and the second semiconductor diode are formed from silicon-carbide material.

4. The inverter module of claim 1, wherein the first semiconductor switch and the first semiconductor diode are antiparallel, and the second semiconductor switch and the second semiconductor diode are antiparallel.

5. The inverter module of claim 4, the first semiconductor switch having a second surface terminal, and the first semiconductor diode having a second surface terminal, wherein the second surface terminal of the first semiconductor switch and the second surface terminal of the first semiconductor diode are coupled to receive a positive voltage potential.

6. The inverter module of claim 5, the second semiconductor switch having a second surface terminal, and the second semiconductor diode having a second surface terminal, wherein the second surface terminal of the second semiconductor switch and the second surface terminal of the second semiconductor diode are coupled to receive a negative voltage potential.

7. The inverter module of claim 6, further comprising:
a third semiconductor switch affixed to the first electrical base, the third semiconductor switch having a first surface terminal coupled to the electrically conductive mounting surface of the first electrical base, and a second surface terminal coupled to the second surface terminal of the first semiconductor switch to receive a positive voltage potential, wherein the third semiconductor switch is parallel to the first semiconductor switch and antiparallel to the first semiconductor diode; and
a fourth semiconductor switch affixed to the first electrical base, the fourth semiconductor switch having a first surface terminal coupled to the electrically conductive mounting surface of the first electrical base, and a second surface terminal coupled to the second surface terminal of the second semiconductor switch to receive a negative voltage potential, wherein the fourth semiconductor switch is parallel to the second semiconductor switch and antiparallel to the second semiconductor diode.

8. The inverter module of claim 6, further comprising:
a third semiconductor diode affixed to the second electrical base, the third semiconductor diode having a first surface terminal coupled to the electrically conductive mounting surface of the second electrical base, and a second surface terminal coupled to the second surface terminal of the first semiconductor diode to receive a positive voltage potential, wherein the third semiconductor diode is parallel to the first semiconductor diode and antiparallel to the first semiconductor switch; and
a fourth semiconductor diode affixed to the second electrical base, the fourth semiconductor diode having a first surface terminal coupled to the electrically conductive mounting surface of the second electrical base, and a second surface terminal coupled to the second surface terminal of the second semiconductor diode to receive a negative voltage potential, wherein the fourth semiconductor diode is parallel to the second semiconductor diode and antiparallel to the second semiconductor switch.

9. The inverter module of claim 1, wherein the first electrical base and the second electrical base are independently sized for different operating temperatures.

10. An inverter phase leg module comprising:
a positive bus bar configured to establish a positive voltage potential for the inverter phase leg module;
a negative bus bar configured to establish a negative voltage potential for the inverter phase leg module;
an output node;
a first electrically conductive base coupled to the output node;
a first switch package having a first surface terminal coupled to the first electrically conductive base, and having a second surface terminal coupled to the positive bus bar;
a second switch package having a first surface terminal coupled to the first electrically conductive base, and having a second surface terminal coupled to the negative bus bar;
a second electrically conductive base coupled to the output node, wherein the second electrically conductive base and the first electrically conductive base are physically distinct;
a first diode package having a first surface terminal coupled to the second electrically conductive base, and having a second surface terminal coupled to the positive bus bar; and
a second diode package having a first surface terminal coupled to the second electrically conductive base, and having a second surface terminal coupled to the negative bus bar.

11. The inverter phase leg module of claim 10, wherein the first electrically conductive base and the second electrically conductive base are formed from a copper material.

12. The inverter phase leg module of claim 10, wherein the first diode package and the second diode package comprise silicon-carbide semiconductor material.

13. The inverter phase leg module of claim 10, wherein the first switch package and the second switch package are semiconductor transistor devices.

14. The inverter phase leg module of claim 10, wherein the first switch package and the first diode package are antiparallel, and the second switch package and the second diode package are antiparallel.

15. The inverter phase leg module of claim 10, wherein the output node is coupled to a winding of an electric motor.

16. The inverter phase leg module of claim 10, further comprising:
a second output node;
a third electrically conductive base coupled to the second output node;
a third switch package having a first surface terminal coupled to the third electrically conductive base, and having a second surface terminal coupled to the positive bus bar;
a fourth switch package having a first surface terminal coupled to the third electrically conductive base, and having a second surface terminal coupled to the negative bus bar;
a fourth electrically conductive base coupled to the second output node, wherein the fourth electrically conductive base and the third electrically conductive base are thermally decoupled;
a third diode package having a first surface terminal coupled to the fourth electrically conductive base, and having a second surface terminal coupled to the positive bus bar; and
a fourth diode package having a first surface terminal coupled to the fourth electrically conductive base, and having a second surface terminal coupled to the negative bus bar.

17. A power inverter module comprising:
a first electrical base, the first electrical base being electrically conductive;
a first transistor switch device having a surface terminal, wherein the surface terminal of the first transistor switch device is coupled to the first electrical base;
a second transistor switch device having a surface terminal, wherein the surface terminal of the second transistor switch device is coupled to the first electrical base;
a second electrical base electrically coupled to, and thermally decoupled from, the first electrical base, the second electrical base being electrically conductive;
a first diode device having a surface terminal, wherein the surface terminal of the first diode device is coupled to the second electrical base; and a second diode device having a surface terminal, wherein the surface terminal of the second diode device is coupled to the second electrical base.

18. The power inverter module of claim 17, wherein the first transistor switch device and the second transistor switch device are affixed to the first electrical base, and the first diode device and the second diode device are affixed to the second electrical base.

19. The power inverter module of claim 17, wherein the first diode device and the second diode device are silicon-carbide semiconductor diodes.

20. The power inverter module of claim 17, wherein the first transistor switch device and the first diode device are antiparallel, and the second transistor switch device and the second diode device are antiparallel.

* * * * *